United States Patent [19]
Ghosh et al.

[11] Patent Number: 5,619,468
[45] Date of Patent: Apr. 8, 1997

[54] TWO-STAGE MEMORY REFRESH CIRCUIT

[75] Inventors: Atish Ghosh; Jennifer B. Pencis, both of Austin, Tex.

[73] Assignee: Advanced Micro Devices, Inc., Sunnyvale, Calif.

[21] Appl. No.: 568,848

[22] Filed: Dec. 7, 1995

[51] Int. Cl.$^6$ .................................................. G06F 12/02
[52] U.S. Cl. .......................................... 365/222; 365/236
[58] Field of Search .................................. 365/222, 236, 365/233

[56] References Cited

U.S. PATENT DOCUMENTS 5,473,770  12/1995  Vrba .................................... 365/222 X
5,475,645  12/1995  Wada ...................................... 365/222
5,511,176   4/1996  Tsuha .................................. 365/222 X

*Primary Examiner*—Do Hyun Yoo
*Attorney, Agent, or Firm*—Skjerven, Morrill, MacPherson, Franklin & Friel

[57] ABSTRACT

A timing refresh circuit refreshes a timed circuit in a functionally equivalent manner, whether the timing refresh circuit is operated at a high frequency or a low frequency. The two-stage timing refresh circuit includes a counter and combinational logic, in combination, connected between a refresh timing signal generator and a control circuit. The counter is incremented for each refresh timing signal and decremented for each refresh cycle realized by the control circuit. The combinational logic converts the counter count to a refresh signal by generating a refresh request to the control circuit whenever a count is pending in the counter.

17 Claims, 3 Drawing Sheets

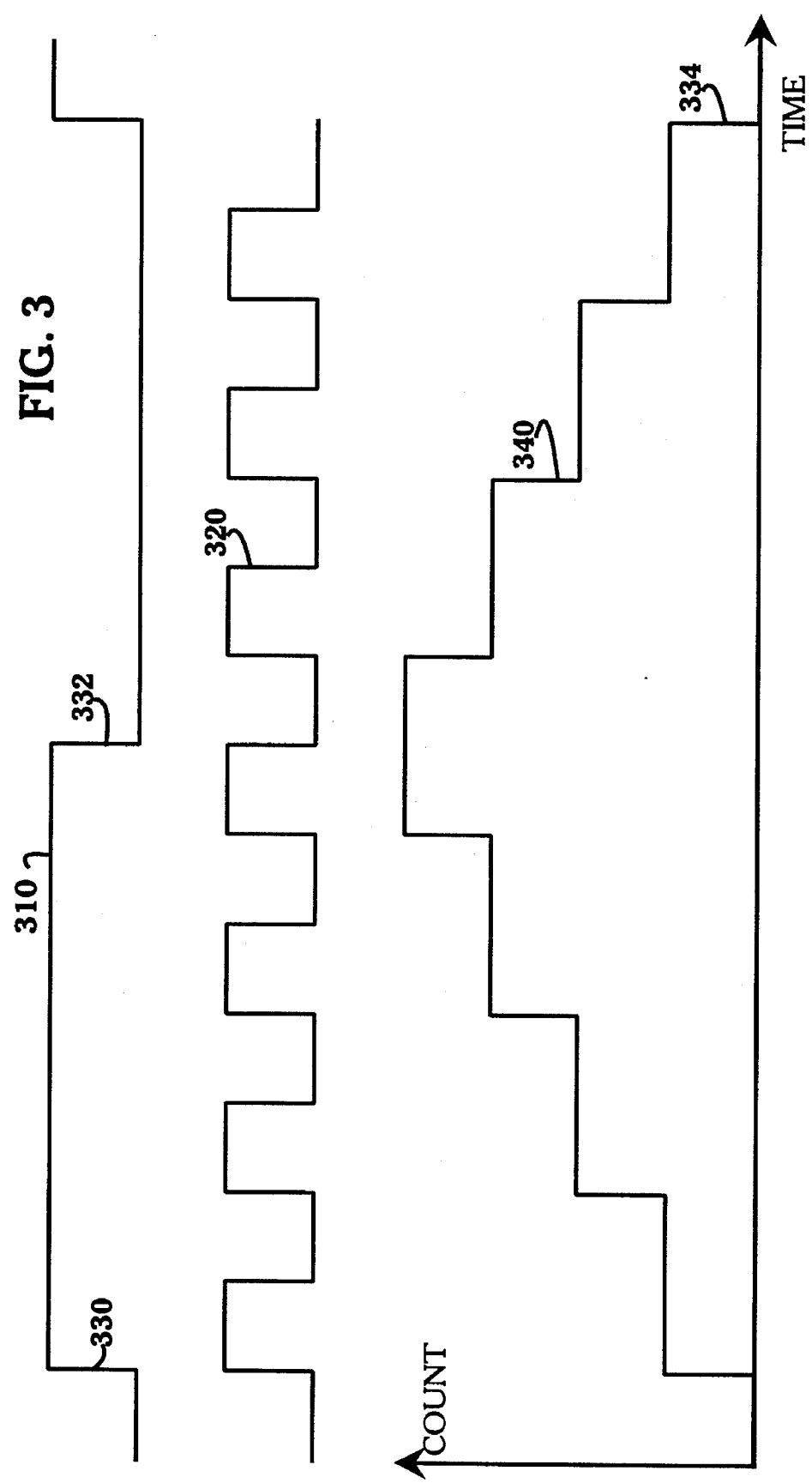

TWO-STAGE MEMORY REFRESH CIRCUIT

BACKGROUND OF THE INVENTION

1. Field of the Invention

This invention relates to a memory refresh circuit. More specifically, this invention relates to a memory refresh circuit for operating a fixed-timing circuit over a substantial range of clock frequencies.

2. Description of the Relevant Art

Due to the complex nature of VLSI circuit designs, including microprocessor circuit designs, validation of the designs includes debugging of circuitry on several levels. For example, a processor design may be tested using silicon parts operating in a motherboard at full speed. The same processor design may also be tested using an emulator operating in a motherboard at low speed.

Silicon parts operate in the motherboard at an operating speed in the range of tens of megahertz. In contrast, the emulator operates in the motherboard at an operating speed in the range of hundreds of kilohertz. Accordingly, the operating speed of the motherboard varies at a ratio of approximately 100 to 1 in this example. Although separate motherboards may be utilized for different testing levels including a high-speed motherboard and a low-speed motherboard, advantages are gained by using the same motherboard for all testing and validation. In particular, usage of a single motherboard substantially reduces the number of variables or differences in operating conditions. Furthermore, usage of a single motherboard is convenient. If the same motherboard is used for both the high speed and low speed applications, the motherboard must have an operating range at least from the hundreds of kilohertz to the tens of megahertz.

Several problems are raised by attempting to operate a motherboard over this wide range of frequencies. For example, the wide range of operating frequencies raises problems with regard to dynamic random access memory (DRAM) refresh. FIG. 1 is a schematic block diagram which illustrates a conventional refresh circuit 100. The conventional refresh circuit 100 includes a refresh clock generator circuit 110, a refresh flip-flop 112, a dynamic random access memory (DRAM) controller 116 and a dynamic random access memory (DRAM) 118. The refresh clock generator circuit 110 generates a rising edge of a periodic signal at a specified rate, for example 15 µs. A typical DRAM, such as DRAM 118, has 256 rows that are refreshed in 4 milliseconds (ms) so that the average refresh rate is 15 microseconds (µs). Accordingly, the typical refresh clock generator circuit 110 generates a refresh signal every 15 µs. The refresh signal sets the flip-flop 112. A refresh cycle takes place when a refresh circuit 100 gains control of the DRAM 118. Once the refresh cycle is completed, the flip-flop 112 is cleared. The underlying implication is that the DRAM 118 must become available to the refresh circuit 100 for refresh before another 15 µs time slice expires. Thus, the typical refresh circuit 100 is synchronized with the typical DRAM 118 on the basis that the average refresh rate of the DRAM 118 is similar to the refresh rate generated by the refresh clock generator circuit 110. No circuits or memory are generally used to enforce this synchronization.

The refresh timing requirement of a DRAM remains the same regardless of the clock rate and operating speed of a processor 106. The DRAM continues to require a designated refresh time. Thus at very low-speed operating rates, such as the rates used in emulation, the very slow access to DRAM 118 of the processor 106 may extend for several refresh cycles. For example, if the processor 106 access is extended to 100 µs, then the refresh time of the DRAM 118 is exceeded. The refresh generator generates six refresh cycles of which only one results in a refresh cycle to the DRAM 118. Five refresh cycles are missed. So much time has transpired between refresh signals to the DRAM 118 that a few refresh cycles are skipped. Under these circumstances, the refresh specification for the DRAM 118 will eventually be violated.

What is needed is a circuit that is functionally the same while operating at high frequency and at low frequency. What is needed is a timing refresh circuit that refreshes a DRAM in a functionally equivalent manner, whether the timing refresh circuit is operated at a high frequency or a low frequency.

SUMMARY OF THE INVENTION

In accordance with the present invention, a timing refresh circuit refreshes a timed circuit in a functionally equivalent manner, whether the timing refresh circuit is operated at a high frequency or a low frequency. The two-stage timing refresh circuit includes a counter and combinational logic, in combination, connected between a refresh timing signal generator and a control circuit. The counter is incremented for each refresh timing signal and decremented for each refresh cycle realized by the control circuit. The combinational logic converts the counter count to a refresh signal by generating a refresh request to the control circuit whenever a count is pending in the counter.

In accordance with one embodiment of the present invention, a timing control circuit controls timing signals to a fixed-timing circuit in a variable-time system. The fixed-timing circuit has an input terminal for receiving a timing signal and an output terminal for generating a timing signal indicative of fixed-timing circuit timing. The fixed-timing circuit is accessible to timing signals of the timing control circuit in a first state and inaccessible to timing signals of the timing control circuit in a second state, the timing control circuit includes a fixed timing signal generator, a counter having a first input terminal connected to the fixed timing signal generator, a second input terminal connected to the output terminal of the fixed-timing circuit and a plurality of output bit lines. The timing control circuit also includes a combinational logic circuit having a plurality of input bit lines connected to the plurality of output bit lines of the counter and an output line connected to the input terminal of the fixed-timing circuit.

In accordance with another embodiment of the present invention, a timing refresh control circuit controls timing signals to a fixed-timing DRAM circuit in a variable-time system. The fixed-timing DRAM circuit has an input terminal for receiving a timing signal and an output terminal for generating a timing signal indicative of fixed-timing circuit timing. The fixed-timing DRAM circuit is accessible to timing signals of the timing refresh control circuit in a first state and inaccessible to timing signals of the timing refresh control circuit in a second state. The timing refresh control circuit includes a fixed timing refresh clock signal generator and a counter having a first input terminal connected to the fixed timing refresh clock signal generator, a second input terminal connected to the output terminal of the fixed-timing DRAM circuit and a plurality of output bit lines. The timing refresh control circuit also includes a combinational logic circuit having a plurality of input bit lines connected to the plurality of output bit lines of the counter and a refresh cycle output line connected to the input terminal of the fixed-timing DRAM circuit.

In accordance with a third embodiment of the invention, a circuit board operates both at emulation speed in a first operating state and at a circuit speed in a second operating state. The circuit board includes a fixed-timing circuit having an input terminal for receiving a timing signal and an output terminal for generating a timing signal indicative of fixed-timing circuit timing. The fixed-timing circuit is accessible to timing signals of the timing control circuit in a first state and inaccessible to timing signals of the timing control circuit in a second state. The circuit board further includes a fixed timing signal generator and a counter having a first input terminal connected to the fixed timing signal generator, a second input terminal connected to the output terminal of the fixed-timing circuit and a plurality of output bit lines. The circuit board also includes a combinational logic circuit having a plurality of input bit lines connected to the plurality of output bit lines of the counter and an output line connected to the input terminal of the fixed-timing circuit.

In accordance with a fourth embodiment of the present invention, a method of controlling timing signals to a fixed-timing circuit in a variable-time system is disclosed. The fixed-timing circuit has an input terminal for receiving a timing signal and an output terminal for generating a timing signal indicative of fixed-timing circuit timing. The fixed-timing circuit is accessible to timing signals of the timing control circuit in a first state and inaccessible to timing signals of the timing control circuit in a second state. The method includes the steps of generating a fixed timing signal, incrementing a count of the number of fixed timing signals and decrementing the count by the number of signals indicative of fixed-timing circuit timing. The method further includes the steps of applying a fixed timing signal to the fixed-timing circuit when the count is greater than one and terminating application of the fixed timing signal to the fixed-timing circuit when the count is decremented to zero.

Numerous advantages are attained by the described circuit and method. One advantage is that the same circuit board may be conveniently used for various test and verification purposes without alteration. Thus, the board may be used for emulating a design at slow clock speeds and for operating an integrated circuit version of the emulated system at high clock speeds. In either case, timing of fixed-timing circuits is maintained at the same operating frequency. Another advantage is that usage of a single board at different operating frequencies substantially improves design verification and debugging by minimizing the number of test variations between an emulated system and an integrated-circuit system. A further advantage is that the described circuit and method is useful for maintaining a substantially constant refresh rate across all of the rows of a memory.

BRIEF DESCRIPTION OF THE DRAWINGS

The present invention may be better understood, and its numerous objects, features, and advantages made apparent to those skilled in the art by referencing the accompanying drawings.

FIG. 3 is a timing diagram which illustrates the timing operation of the two-stage refresh circuit shown in FIG. 2.

DETAILED DESCRIPTION OF THE INVENTION

The following sets forth a detailed description of the best contemplated mode for carrying out the invention. The description is intended to be illustrative of the invention and should not be taken to be limiting.

Figure 1:
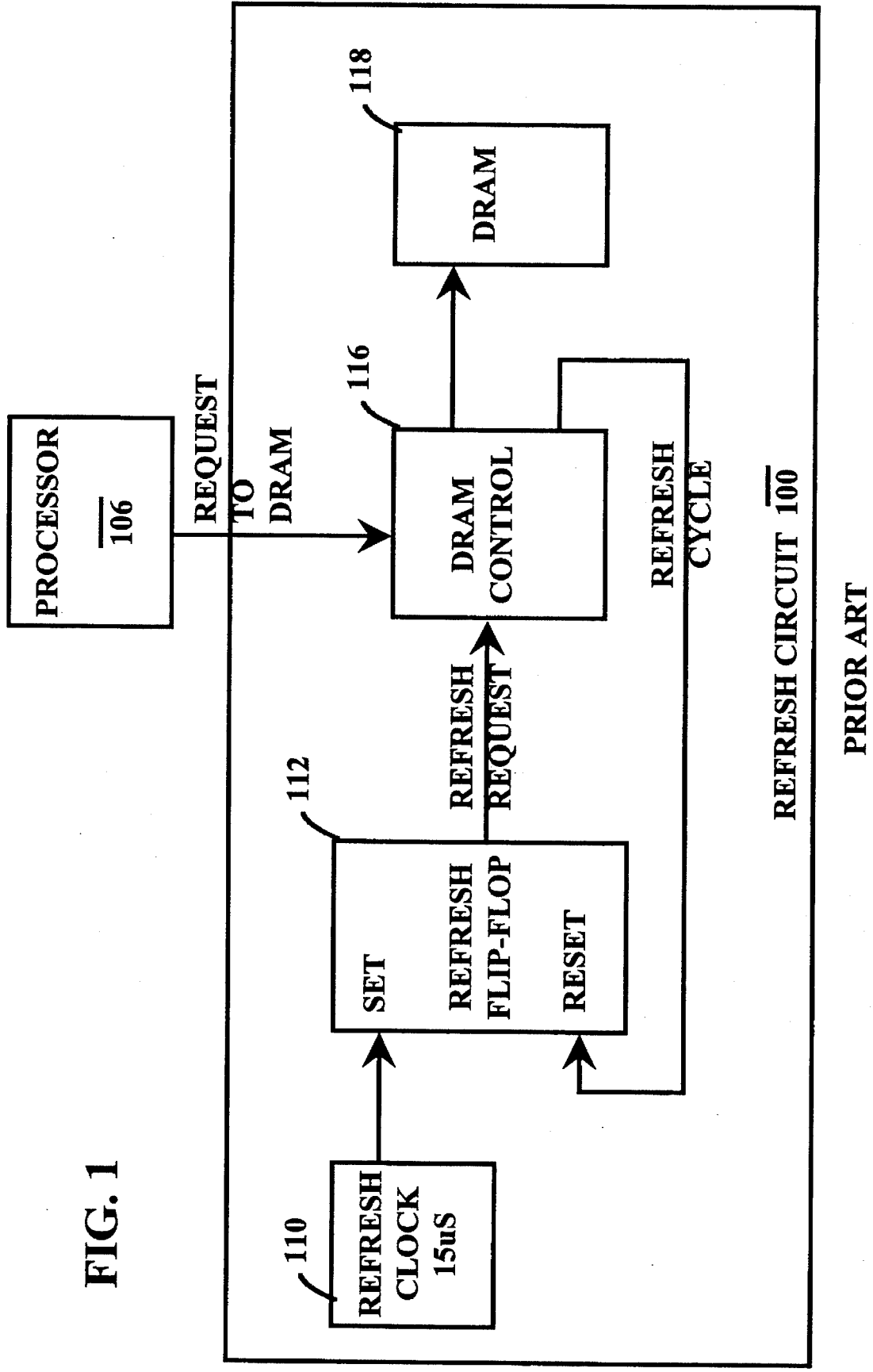
FIG. 1, labeled PRIOR ART, is a schematic block diagram which illustrates a conventional refresh circuit.
Figure 2:
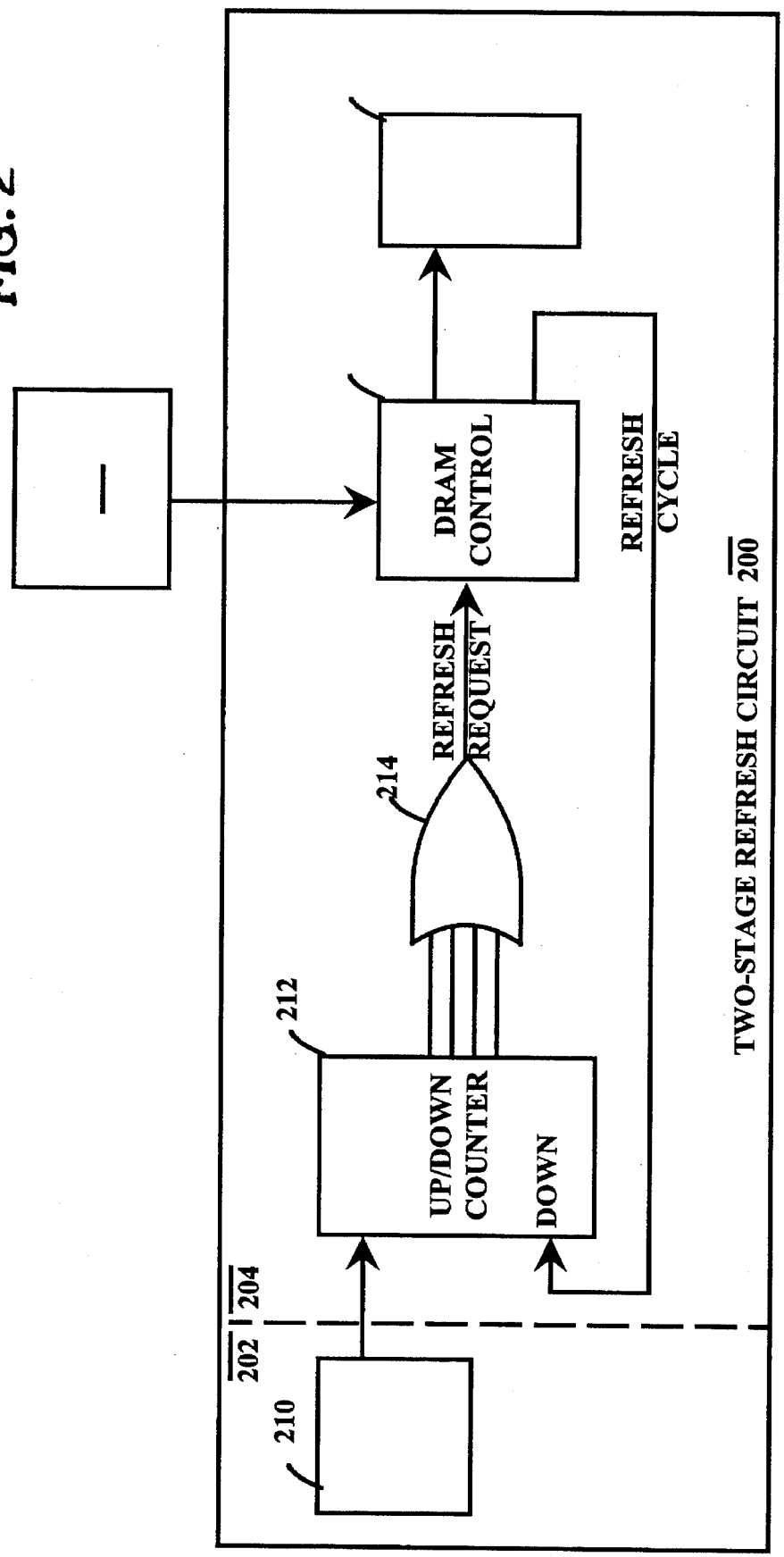
FIG. 2 is a schematic block diagram of a two-stage refresh circuit in accordance with an embodiment of the present invention.

Referring to FIG. 2, a two-stage refresh circuit 200 is shown which includes a refresh clock generator circuit 210, an up/down counter 212, a multiple-input OR gate 214, a dynamic random access memory (DRAM) controller 216 and a dynamic random access memory (DRAM) 218. The two-stage refresh circuit 200 includes a first stage 202 and a second stage 204. The first stage 202 is the refresh clock generator circuit 210 which generates a periodic refresh clock signal. In an illustrative embodiment, the refresh clock generator circuit 210 generates the refresh clock signal every 15 µs. The second stage 204 includes the up/down counter 212, the multiple-input OR gate 214, the DRAM controller 216 and the DRAM 218. The DRAM controller 216 is a suitable dynamic RAM controller, as is known in the an of memory circuits. Typical DRAM controllers are used to supply control signals, such as timing control signals, to a DRAM memory. DRAM controllers also receive and generate control signals such as timing signals from circuit blocks such as a processor 206. The DRAM 218 is a suitable dynamic RAM memory, as is known in the art of memory circuits.

The refresh clock signal is communicated from the refresh clock generator circuit 210 to the up/down counter 212. The up/down counter 212 is updated by incrementing for each refresh cycle of 15 µs timing signals generated by the refresh clock generator circuit 210. The up/down counter 212 is also updated by decrementing for each refresh cycle signal from the DRAM controller 216. In this manner, when a processor 206 is operating at a low speed and accessing the DRAM 218 so that the DRAM 218 is not available to the refresh circuit 200 for refreshing at the high rate of the refresh clock generator circuit 210, the number of refresh clock signals is continually counted up. At the same time, because the DRAM 218 is not available to the refresh circuit 200 for refreshing, the DRAM controller 216 does not generate refresh cycle signals and the up/down counter 212 is not counted down.

When the refresh circuit 200 gains access to the DRAM 218 to pass refresh timing signals to the DRAM 218, the DRAM 218 is refreshed under control of DRAM controller 216. For each refresh cycle, the refresh cycle signal is applied to the up/down counter 212 to decrement the count so that the refresh circuit 200 runs the number of refresh cycles that are accumulated in the up/down counter 212. When the count in the up/down counter 212 reaches a predefined number, for example zero, refresh timing signals are no longer applied to the DRAM controller 216. Thus, for an extended DRAM access time resulting in an extended time without DRAM refresh cycles, the up/down counter 212 counts the number of missed refresh events. When the DRAM becomes accessible for refresh, the counter generates refresh signals in a sequence of refresh counts until all missed refresh cycles are restored. The DRAM 218 is not available to the processor 206 until all refreshes are completed.

The refresh circuit 200 serves to synchronize the timing of refresh events across a memory circuit so that a substantially constant refresh rate is advantageously maintained across all of the rows of a memory.

When the count in the up/down counter 212 is updated to a designated value, for example zero, the refresh circuit 200 relinquishes control of the DRAM 218. When the refresh clock generator circuit 210 is running at a high operating speed, for example tens of megahertz, the two stage refresh circuit 200 operates in the manner of a conventional refresh circuit since the count of the up/down counter 212 never exceeds one. Thus, when the refresh circuit 200 runs at a high operating speed, the up/down counter 212 behaves like a single flip-flop.

The refresh clock generator circuit 210 generates a rising edge of a periodic signal at a specified rate, for example 15 µs. These periodic signals are used to synchronize operations in a computer system, for example. The refresh clock generator circuit 210 is connected to an up-count input terminal of the up/down counter 212. The up/down counter 212 also has a down-count input terminal and a plurality of output lines which generate a digital count signal. The up/down counter 212 counts up on a rising edge of a signal from the refresh clock generator circuit 210 on the up-count input terminal. The up/down counter 212 counts down on a rising edge of a signal on the down-count input terminal. The size of the up/down counter, in bits, is selected based on the duration of the high-speed clock interval and the low-speed clock interval for the system into which the two-stage refresh circuit 200 is implemented. Specifically, in one embodiment the bit-width of the up/down counter 212 is set according to equation (1), as follows:

$$\text{bitwidth} = 1 + \log_2(T_l/T_c),$$

where $T_l$ is the time of the longest access and $T_c$ is the high speed clock interval.

A refresh request is generated by the up/down counter 212 and applied to the DRAM controller 216 when any of the bits in the up/down counter 212 is equal to 1. Thus, the only time a refresh request is not generated is when all bits in the up/down counter 212 are equal to zero. The DRAM controller 216 generates a refresh signal, such as a RAS#-only refresh signal or a CAS#-before-RAS#refresh, for application to the DRAM 218. The DRAM controller 216 also generates a refresh cycle signal that is applied to the down-count input terminal of the up/down counter 212.

A DRAM controller 216 typically affords a refresh signal the highest priority when arbitrating for control of the DRAM 218 so that the refresh circuit 200 retains control of the DRAM 218 as long as outstanding refresh requests are logged by the up/down counter 212.

Referring to FIG. 3, a timing diagram illustrates timing relevant to the operation of refresh circuit 200. An external clock signal 310 is operating at a low frequency relative to the rate of the refresh clock signal 320 which is generated by the refresh clock generator circuit 210. At time A 330, an external circuit such as a processor 206 accesses the DRAM 218 so that access is denied to the refresh circuit 200. Cycles of the refresh clock signal 320 are not applied as timing signals to the DRAM 218. Instead, the count 340 of the up/down counter 212 is incremented for each refresh clock signal 320 cycle. At time B 332 when the external circuit cedes access to the refresh circuit 200, the refresh clock signal 320 is applied to the DRAM 218 and the counter is decremented to zero at time C 334.

Other Embodiments

While the invention has been described with reference to various embodiments, it will be understood that these embodiments are illustrative and that the scope of the invention is not limited to them. Many variations, modifications, additions, and improvements of the embodiments described are possible.

For example, the illustrative embodiment specifically states various refresh and system clock rates and durations. These specific rates and durations are expressed merely to clarify the operation of the refresh circuit. Numerous other clock rates and durations may be implemented, without limitation, within the scope of the present invention. For example, one specific embodiment includes a processor operating on a silicon validation board. The silicon validation board is used for circuit emulation while operating a processor at an 80 kHz rate and used for silicon testing while operating at a 30 MHz rate.

Also, the illustrative embodiment particularly identified as a DRAM refresh circuit. The inventive circuit and circuit operating method is also applicable to other types of circuits to generally include all types of circuits that maintain the same time scale despite changes in overall circuit operating speed. For example, in a processor circuit certain operating signals are appropriate for scaling in proportion to the speed of the processor. Other signals are maintained and not scaled.

These and other variations, modifications, additions, and improvements may fall within the scope of the invention as defined in the claims which follow.

What is claimed is:

1. A timing control circuit for controlling timing signals to a fixed-timing circuit in a variable-time system, the fixed-timing circuit having an input terminal for receiving a timing signal and an output terminal for generating a timing signal indicative of fixed-timing circuit timing, the fixed-timing circuit being accessible to timing signals of the timing control circuit in a first state and inaccessible to timing signals of the timing control circuit in a second state, the timing control circuit comprising:

a fixed timing signal generator;

a counter having a first input terminal coupled to the fixed timing signal generator, a second input terminal coupled to the output terminal of the fixed-timing circuit and a plurality of output bit lines; and a combinational logic circuit having a plurality of input bit lines coupled to the plurality of output bit lines of the counter and an output line coupled to the input terminal of the fixed-timing circuit.

2. A timing control circuit according to claim 1, wherein:

the counter is an up/down counter;

the first input terminal of the counter is an up-count terminal; and the second input terminal of the counter is a down-count terminal.

3. A timing control circuit according to claim 1 wherein:

the fixed-timing circuit is a DRAM circuit including a DRAM controller;

the combinational logic circuit output line carries a refresh request signal; and the counter second input terminal is coupled to the DRAM circuit to receive a refresh cycle signal.

4. A timing control circuit according to claim 1 wherein:

the combinational logic circuit is a multiple-input OR gate for selecting a selected count of the counter.

5. A timing refresh control circuit for controlling timing signals to a fixed-timing DRAM circuit in a variable-time system, the fixed-timing DRAM circuit having an input terminal for receiving a timing signal and an output terminal for generating a timing signal indicative of fixed-timing circuit timing, the fixed-timing DRAM circuit being accessible to timing signals of the timing refresh control circuit in a first state and inaccessible to timing signals of the timing refresh control circuit in a second state, the timing refresh control circuit comprising:

a fixed timing refresh clock signal generator;

a counter having a first input terminal coupled to the fixed timing refresh clock signal generator, a second input terminal coupled to the output terminal of the fixed-timing DRAM circuit and a plurality of output bit lines; and a combinational logic circuit having a plurality of input bit lines coupled to the plurality of output bit lines of the counter and a refresh cycle output line coupled to the input terminal of the fixed-timing DRAM circuit.

6. A timing refresh control circuit according to claim 5, wherein:

the counter is an up/down counter;

the first input terminal of the counter is an up-count terminal; and the second input terminal of the counter is a down-count terminal.

7. A timing refresh control circuit according to claim 5 wherein:

the combinational logic circuit is a multiple-input OR gate for selecting a selected count of the counter.

8. A circuit board for operating at emulation speed in a first operating state and for operating at a circuit speed in a second operating state, the circuit board comprising:

a fixed-timing circuit having an input terminal for receiving a timing signal and an output terminal for generating a timing signal indicative of fixed-timing circuit timing, the fixed-timing circuit being accessible to signals of the circuit board in a first state and inaccessible to timing signals of the circuit board in a second state;

a fixed timing signal generator;

a counter having a first input terminal coupled to the fixed timing signal generator, a second input terminal coupled to the output terminal of the fixed-timing circuit and a plurality of output bit lines; and a combinational logic circuit having a plurality of input bit lines coupled to the plurality of output bit lines of the counter and an output line coupled to the input terminal of the fixed-timing circuit.

9. A circuit board according to claim 8, wherein:

the counter is an up/down counter;

the first input terminal of the counter is an up-count terminal; and the second input terminal of the counter is a down-count terminal.

10. A circuit board according to claim 8 wherein:

the fixed-timing circuit is a DRAM circuit including a DRAM controller;

the combinational logic circuit output line carries a refresh request signal; and the counter second input terminal is coupled to the DRAM circuit to receive a refresh cycle signal.

11. A circuit board according to claim 8 wherein:

the combinational logic circuit is a multiple-input OR gate for selecting a selected count of the counter.

12. A method of controlling timing signals to a fixed-timing circuit in a variable-time system, the fixed-timing circuit having an input terminal for receiving a timing signal and an output terminal for generating a timing signal indicative of fixed-timing circuit timing, the fixed-timing circuit being accessible to timing signals in a first state and inaccessible to timing signals in a second state, the method comprising the steps of:

generating a fixed timing signal;

incrementing a count of the number of fixed timing signals;

decrementing the count by the number of signals indicative of fixed-timing circuit timing;

applying the fixed timing signal to the fixed-timing circuit when the count is greater than one; and terminating application of the fixed timing signal to the fixed-timing circuit when the count is decremented to zero.

13. A method according to claim 12 wherein:

the fixed-timing circuit is a DRAM circuit including a DRAM controller;

the fixed timing signal is a refresh request signal; and the timing signal indicative of fixed-timing circuit timing is a refresh cycle signal.

14. A method of providing a timing control circuit for controlling timing signals to a fixed-timing circuit in a variable-time system, the fixed-timing circuit having an input terminal for receiving a timing signal and an output terminal for generating a timing signal indicative of fixed-timing circuit timing, the fixed-timing circuit being accessible to timing signals of the timing control circuit in a first state and inaccessible to timing signals of the timing control circuit in a second state, the method comprising the steps of:

providing a fixed timing signal generator;

providing a counter having a first input terminal coupled to the fixed timing signal generator, a second input terminal coupled to the output terminal of the fixed-timing circuit and a plurality of output bit lines; and providing a combinational logic circuit having a plurality of input bit lines coupled to the plurality of output bit lines of the counter and an output line coupled to the input terminal of the fixed-timing circuit.

15. A method according to claim 14, wherein:

the counter is an up/down counter;

the first input terminal of the counter is an up-count terminal; and the second input terminal of the counter is a down-count terminal.

16. A method according to claim 14 wherein:

the fixed-timing circuit is a DRAM circuit including a DRAM controller;

the combinational logic circuit output line carries a refresh request signal; and the counter second input terminal is coupled to the DRAM circuit to receive a refresh cycle signal.

17. A method according to claim 14 wherein:

the combinational logic circuit is a multiple-input OR gate for selecting a selected count of the counter.

\* \* \* \* \*

UNITED STATES PATENT AND TRADEMARK OFFICE
CERTIFICATE OF CORRECTION

PATENT NO.    : 5,619,468
DATED         : April 8, 1997
INVENTOR(S)   : Ghosh et al.

It is certified that error appears in the above-identified patent and that said Letters Patent is hereby corrected as shown below:

Col. 4,   line 9, delete "OR" and insert --OR--;

Col. 5,   in the equation between lines 25-30, delete "$\log_2$" and insert --log 2--.

Signed and Sealed this

Twenty-third Day of September, 1997

Attest:

BRUCE LEHMAN

Attesting Officer

Commissioner of Patents and Trademarks